(12) United States Patent
Monavarian et al.

(10) Patent No.: US 11,177,126 B2
(45) Date of Patent: Nov. 16, 2021

(54) REMOVING OR PREVENTING DRY ETCH-INDUCED DAMAGE IN AL/IN/GAN FILMS BY PHOTOELECTROCHEMICAL ETCHING

(71) Applicant: STC.UNM, Albuquerque, NM (US)

(72) Inventors: Morteza Monavarian, Albuquerque, NM (US); Daniel Feezell, Albuquerque, NM (US); Andrew Aragon, Albuquerque, NM (US); Saadat Mishkat-Ul-Masabih, Albuquerque, NM (US); Andrew Allerman, Tijeras, NM (US); Andrew Armstrong, Albuquerque, NM (US); Mary Crawford, Albuquerque, NM (US)

( * ) Notice: Subject to any disclaimer, the term of this patent is extended or adjusted under 35 U.S.C. 154(b) by 76 days.

(21) Appl. No.: 16/684,313

(22) Filed: Nov. 14, 2019

(65) Prior Publication Data

US 2020/0161126 A1 May 21, 2020

Related U.S. Application Data

(60) Provisional application No. 62/767,575, filed on Nov. 15, 2018.

(51) Int. Cl.
*H01L 21/02* (2006.01)
*H01L 21/3065* (2006.01)
*H01L 21/306* (2006.01)

(52) U.S. Cl.
CPC .... *H01L 21/02057* (2013.01); *H01L 21/0254* (2013.01); *H01L 21/02389* (2013.01); *H01L 21/02433* (2013.01); *H01L 21/3065* (2013.01); *H01L 21/30612* (2013.01)

(58) Field of Classification Search
CPC ........... H01L 21/02389; H01L 21/0254; H01L 21/30612; H01L 21/2003
See application file for complete search history.

(56) References Cited

PUBLICATIONS

Jones et al., Review of Commercial GaN Power Devices and GaN-Based Converter Design Challenges, IEEE Journal of Emerging and Selected Topics in Power Electronics, vol. 4, No. 3, Sep. 2016, pp. 707-719.
Tsao et al., Ultrawide-Bandgap Semiconductors: Research Opportunities and Challenges, Adv. Electron. Mater. 2018, 4, 1600501, pp. 1-49.
Flack et al., GaN Technology for Power Electronic Applications: A Review, Journal of Electronic Materials, vol. 45, No. 6, 2016, pp. 2673-2682.

(Continued)

*Primary Examiner* — Robert G Bachner
*Assistant Examiner* — Molly K Reida
(74) *Attorney, Agent, or Firm* — MH2 Technology Law Group LLP

(57) ABSTRACT

A method comprises providing a substrate comprising an n-type Al/In/GaN semiconductor material. A surface of the substrate is dry-etched to form a trench therein and cause dry-etch damage to remain on the surface. The surface of the substrate is immersed in an electrolyte solution and illuminated with above bandgap light having a wavelength that generates electron-hole pairs in the n-type Al/In/GaN semiconductor material, thereby photoelectrochemically etching the surface to remove at least a portion of the dry-etch damage.

20 Claims, 2 Drawing Sheets

(56) References Cited

PUBLICATIONS

Du et al., Design of high breakdown voltage vertical GaN p-n diodes with high-K/low-K compound dielectric structure for power electronics applications, Superlattices and Microstructures 111 (2017), pp. 302-309.

Kizilyalli et al., Vertical Power p-n Diodes Based on Bulk GaN, IEEE Transactions on Electron Devices, vol. 62, No. 2, Feb. 2015, pp. 414-422.

Ji et al., Design of 1.2 kV Power Switches With Low RON Using GaN-Based Vertical JFET, IEEE Transactions on Electron Devices, vol. 62, No. 8, Aug. 2015, pp. 2571-2578.

Ji et al., Dynamic Modeling and Power Loss Analysis of High-Frequency Power Switches Based on GaN CAVET, IEEE Transactions on Electron Devices, vol. 63, No. 10, Oct. 2016, pp. 4011-4017.

Reshchikov et al., Zero-phonon line and fine structure of the yellow luminescence band in GaN, Physical Review B 94, 035201 (2016), p. 035201-1-035201-9.

Neugebauer et al., Gallium vacancies and the yellow luminescence in GaN, Applied Physics Letters 69, 503 (1996), pp. 503-505.

Dickerson et al., Vertical GaN Power Diodes With a Bilayer Edge Termination, IEEE Transactions on Electron Devices, vol. 63, No. 1, Jan. 2016, pp. 419-425.

Hu et al., 1.1-kV Vertical GaN p-n Diodes With p-GaN Regrown by Molecular Beam Epitaxy, IEEE Electron Device Letters, vol. 38, No. 8, Aug. 2017, pp. 1071-1074.

Khare et al., Dopant Selective Photoelectrochemical Etching of a GaAs Homostructures, J. Electrochem. Soc., vol. 138, No. 5, May 1991, pp. 1516-1519.

Khare et al., Micromachining in III-V semiconductors using wet photoelectrochemical etching, Journal of Vacuum Science & Technology B: Microelectronics and Nanometer Structures Processing, Measurement, and Phenomena 11, 2497 (1993), pp. 2497-2601.

Li et al., Activation of buried p-GaN in MOCVDregrown vertical structures, Appl. Phys. Lett. 113, 062105 (2018), p. 062105-1-062105-5.

Minsky et al., Room-temperature photoenhanced wet etching of GaN, Appl. Phys. Lett. 68, 1531 (1996), pp. 1531-1533.

Pickrell et al., Investigation of dry-etch-induced defects in >600 V regrown, vertical, GaN, p-n diodes using deep-level optical spectroscopy, J. Appl. Phys. 126,145703 (2019), 145703-1-145703-7.

Tamboli et al., Smooth Top-Down Photoelectrochemical Etching of m-Plane GaN, Journal of The Electrochemical Society, 156 (1), 2009, pp H47-H51.

Youtsey et al., Highly anisotropic photoenhanced wet etching of -type GaN, Appl. Phys. Lett. 71, 2151 (1997), pp. 2151-2153.

Youtsey et al., Broad-area photoelectrochemical etching of GaN, Electronic Letters, vol. 33, No. 3, Jan. 30, 1997, pp. 245-246.

REMOVING OR PREVENTING DRY ETCH-INDUCED DAMAGE IN AL/IN/GAN FILMS BY PHOTOELECTROCHEMICAL ETCHING

CROSS-REFERENCE TO RELATED APPLICATION

This application claims the benefit of U.S. Provisional Application No. 62/767,575, filed Nov. 15, 2018, which is incorporated herein by reference in its entirety.

STATEMENT OF GOVERNMENT INTEREST

This invention was made with Government support under Contract No. DE-AR0000869 awarded by the United States Department of Energy. The Government has certain rights in the invention.

FIELD OF THE DISCLOSURE

The present invention relates to semiconductor etching and, in particular, to a method to remove dry-etch damage in Al/In/GaN films by photoelectrochemical etching.

BACKGROUND

GaN is an attractive candidate to replace Si for high-power electronic devices due to its wide band gap, high electron saturation velocity, large thermal conductivity, and high breakdown field. See E. A. Jones et al., IEEE J. Emerg. Sel. Top. Power Electron. 4, 707 (2016); J. Y. Tsao et al., Adv. Electron. Mater. 4(1), 1600501 (2018); and T. J. Flack et al., J. Electron. Mater. 45, 2673 (2016). Vertical-geometry devices are of particular interest compared to lateral designs because of their high blocking voltage and small form factor. See J. R. Dickerson et al., IEEE Trans. Electron Devices 63, 419 (2016); J. Du et al., Superlattices Microstruct. 111, 302 (2017); and I. C. Kizilyalli et al., IEEE Trans. Electron Devices 62, 414 (2015). Realization of complex vertical device architectures such as junction field effect transistors (JFETs) and current aperture vertical electron transistors (CAVETs) would be accelerated by the formation of etched-and-regrown p-n junctions within selectively defined areas. See D. Ji and S. Chowdhury, IEEE Trans. Electron Devices 62, 2571 (2015); and D. Ji et al., IEEE Trans. Electron Devices 63, 4011 (2016). However, regrown junctions normally exhibit higher reverse leakage currents than continuously grown junctions. See Z. Hu et al., IEEE Electron Device Lett. 38, 1071 (2017).

Thus, novel techniques for forming regrown junctions that can reduce reverse leakage currents would be recognized as a desirable contribution in the art.

SUMMARY

An embodiment of the present disclosure is directed to a method. The method comprises providing a substrate comprising an n-type Al/In/GaN semiconductor material. A surface of the substrate is dry-etched to form a trench therein and cause dry-etch damage to remain on the surface. The surface of the substrate is immersed in an electrolyte solution and illuminated with above bandgap light having a wavelength that generates electron-hole pairs in the n-type Al/In/GaN semiconductor material, thereby photoelectrochemically etching the surface to remove at least a portion of the dry-etch damage.

The present disclosure is also directed to a method for removing dry-etch damage from a substrate surface. The method comprises providing a substrate comprising an n-type Al/In/GaN semiconductor material, a surface of the substrate having dry-etch damage thereon. The surface of the substrate is immersed in an electrolyte solution and illuminated with above bandgap light having a wavelength that generates electron-hole pairs in the n-type Al/In/GaN semiconductor material, thereby photoelectrochemically etching the surface to remove at least a portion of the dry-etch damage.

Another embodiment of the present disclosure is directed to a method for forming a p-n junction. The method comprises providing a substrate comprising an n-type GaN semiconductor material. A surface of the substrate is dry-etched to form a trench therein and causing dry-etch damage to remain on the surface. The surface of the substrate is immersed in an electrolyte solution and illuminated with above bandgap light having a wavelength that generates electron-hole pairs in the n-type GaN semiconductor material, thereby photoelectrochemically etching the surface to remove at least a portion of the dry-etch damage. A p-type GaN semiconductor is regrown on the photoelectrochemically etched surface to form a p-n junction.

It is to be understood that both the foregoing general description and the following detailed description are exemplary and explanatory only and are not restrictive of the present teachings, as claimed.

BRIEF DESCRIPTION OF THE DRAWINGS

The accompanying drawings, which are incorporated in and constitute a part of this specification, illustrates embodiments of the present teachings and together with the description, serve to explain the principles of the present teachings.

FIG. 1A is a cross-sectional schematic illustration of an n-GaN drift layer on an n-type GaN substrate. FIG. 1B is an illustration of dry-etching a trench in the drift layer. FIG. 1C is an illustration of photoelectrochemical (PEC) etching of the surface of the trench to remove the dry-etch induced damage. FIG. 1D is an illustration a p-type GaN regrown in the PEC-etched trench to form a planar GaN p-n diode.

Figure 1A:
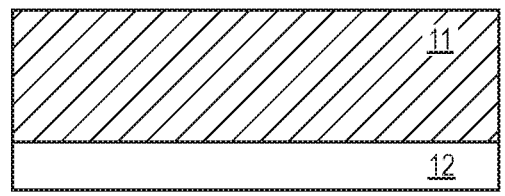
FIGS. 1A-1D illustrate the fabrication of a vertical GaN p-n diode with embedded geometry.

It should be noted that some details of the figure have been simplified and are drawn to facilitate understanding of the embodiments rather than to maintain strict structural accuracy, detail, and scale.

DESCRIPTION OF THE EMBODIMENTS

Reference will now be made in detail to embodiments of the present teachings, examples of which are illustrated in the accompanying drawings. In the drawings, like reference numerals have been used throughout to designate identical elements. In the following description, reference is made to the accompanying drawings that forms a part thereof, and in which is shown by way of illustration specific exemplary embodiments in which the present teachings may be practiced. The following description is, therefore, merely exemplary.

The present disclosure is directed to methods for reducing or eliminating the problem of higher reverse leakage currents that have been found to occur in regrown junctions when compared with continuously grown junctions. Applicants have determined that the problem may be caused by etch-induced damage and impurity incorporation at the regrowth interfaces. In etched-trench geometry devices, the regrowth interfaces include both c-plane and nonpolar m-plane (or a-plane) facets. Certain high-index semipolar planes could also be exposed depending on the geometry and dry etching condition. In particular, the relatively high density of defects in c-plane GaN results in rough surfaces. Controlling the etch damage and impurity levels on the exposed planes (nonpolar, polar, and/or semipolar) is desirable for achieving low-leakage devices and/or selectively doped geometries.

The present disclosure is directed to a method of removing dry-etch damage in Al/In/GaN films using a photoelectrochemical (PEC) etching process. The method can be used to form an etched-and-regrown GaN p-n diode. As an example of the invention, a method for fabricating an etched-and-regrown planar GaN p-n diode is described below.

A substrate comprising a n-type Al/In/GaN semiconductor material is provided. The n-type Al/In/GaN semiconductor can be chosen from GaN, InGaN, AlGaN, AlInGaN, and combinations thereof. For example, as shown in FIG. 1A, a n-GaN drift layer 11 is deposited on a freestanding n-GaN substrate 12, thereby forming a substrate that is suitable for etching and regrowth. For example, the drift layer 11 can comprise a thick (microns) low-doped n-type (e.g., n~1× $10^{16}$ cm$^{-3}$ to ~5×$10^{16}$ cm$^{-3}$) layer. As an example, the freestanding substrate 12 can be a commercially-available, hydride vapor phase epitaxy (HVPE) n-type GaN substrate.

Figure 1B:
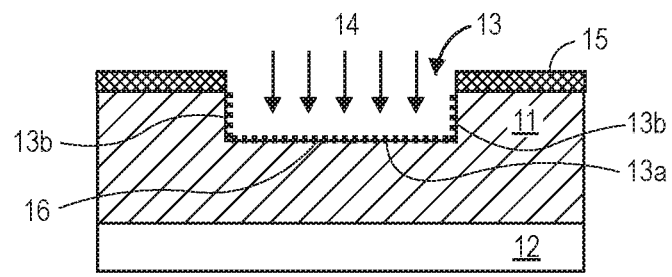

As shown in FIG. 1B, a well or trench 13 is dry-etched 14 on the surface of drift layer 11 through a patterned metal mask 15. For example, the trench 13 can be less than about one micron deep. For example, the dry etching method can include inductively-coupled plasma (ICP) or reactive-ion etching (RIE) to remove the n-GaN drift layer material and form the trench 13 in the drift layer 11. Such dry etching methods can lead to ion-induced damage of the semiconductor. See G. W. Pickrell et al., *J. Appl. Phys.* 126, 145703 (2019). In particular, dry-etch induced damage 16 on the bottom 13a and sidewalls 13b of the trench can strongly degrade the electrical performance of a regrown p-n junction. Therefore, post-etch mitigation of the surface defects on the various regrowth surfaces is desirable to form a high quality etched-and-regrown p-n junction. The exposed bottom 13a of the trench can be, for example, a polar, c-plane surface and the sidewalls 13b can be, for example, a nonpolar, m-plane surface.

Photoelectrochemical (PEC) etching can be used to remove the damage caused by the dry etching of a substrate comprising Al/In/GaN semiconductor. Normally, GaN slowly etches in a KOH electrolyte solution, particularly the low-doped drift layers which are employed to obtain high-voltage power switches. However, by exciting the GaN drift layer with an above bandgap excitation while floating in an aqueous electrolyte solution, the etch rate increases significantly. In particular, PEC etching provides a robust and fast approach to remove the surface damage formed during ICP or RIE etching of GaN films. PEC etching of GaN is generally known in the art. See R. Khare et al., *J. Vac. Sci. Technol.* 11(6), 2497 (1993); C. Youtsey et al., *Appl. Phys. Lett.* 71(15), 2151 (1997); C. Youtsey et al., *Electron Lett.* 33, 245 (1997); and A. C. Tamboli et al., *J. Electrochem. Soc.* 156, H47 (2009).

Figure 1C:
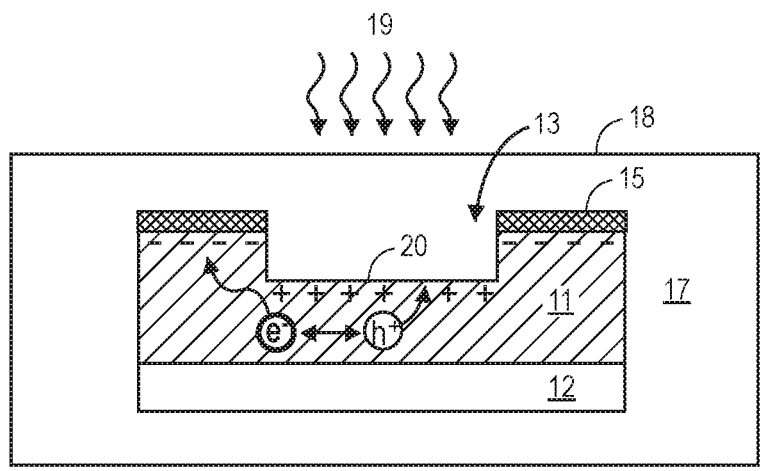

FIG. 1C illustrates the method of PEC etching. The dry-etched GaN surface is immersed in an electrolyte 17 in an electrochemical cell 18. In PEC, above bandgap excitation light (e.g., ultraviolet) 19 is used to photogenerate electron-hole pairs (e$^-$-h$^+$) at the unmasked dry-etched portion 20 of the semiconductor surface. For example, an arc lamp can be used to excite the semiconductor above the GaN bandgap. Photogenerated electrons are extracted through the patterned metal electrode 15 on the unetched portion of the semiconductor surface and participate in a reduction reaction with the aqueous electrolyte 17. The photogenerated holes are pulled to the surface in n-type semiconductors by surface band bending and are consumed by the oxidative dissolution of the semiconductor surface, allowing the exposed surface of GaN to PEC etch and thereby reduce or remove the damage caused by the dry-etch. Only those portions of the semiconductor material that contain photogenerated holes at the surface will etch. The reactions are listed below:

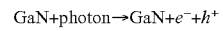

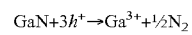

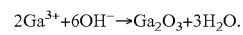

The PEC etch methods of the present disclosure do not introduce substantial surface roughness that vitiates the ability for high quality epitaxial regrowth with good surface morphology on at least etched GaN m-plane surfaces. Surface smoothness may be achieved by using a relatively slow etch rate and a low molarity solution.

Figure 1D:
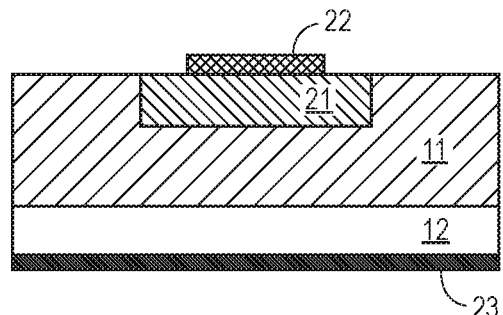

As shown in FIG. 1D, a layer of p-type GaN 21 can be regrown in the PEC-etched trench using, for example, metal-organic, chemical-vapor deposition (MOCVD) of p-type GaN. The layer of p-type GaN can have any desired concentration of p-type dopant, such as, for example, about 3×$10^{17}$ cm$^{-3}$. A metal ohmic p-contact 22 can be deposited on the regrown layer of p-type GaN 21 and an n-contact 23 can be blanket deposited on the backside of the n-GaN freestanding substrate 12 to form a vertical GaN p-n diode with embedded geometry. Additional fabrication processes can be used to realize more advanced GaN devices, such as JFETs or CAVETs.

A photoluminescence (PL)-based approach can be used to evaluate the effectiveness of etch-induced damage removal using the PEC method, as is illustrated in the Examples below. The intensity of GaN near-band-edge (NBE) emission (~365 nm) lines can be probed with respect to the yellow luminescence (YL) line (~580 nm). Due to the pure defect nature of the YL, the ICP dry etching can be assumed to increase the concentration of such defects, thus increase their YL emission intensity with respect to GaN NBE. See M. A. Reshchikov et al., *Phys. Rev. B* 94, 035201 (2016); and J. Neugebauer and C. G. Van de Walle, *Appl. Phys. Lett.* 69, 503 (1996).

EXAMPLES

Comparative Example 1

Figure 2A:
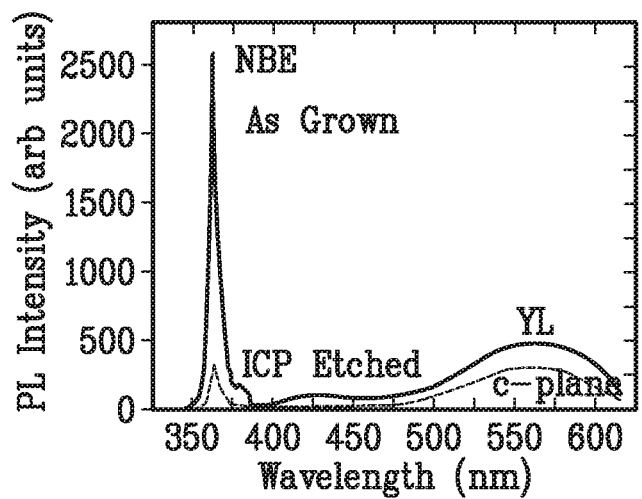
FIG. 2A is a graph showing photoluminescence (PL) spectra for a c-plane as-grown drift layer compared to a c-plane inductively coupled plasma (ICP) etched.

FIG. 2A compares the PL spectra for a c-plane low-doped (2×$10^{16}$ cm$^{-3}$) GaN drift layer before and after ICP etching (with etch depth ~400 nm). The ratio of NBE to YL (NBE/YL) dropped from ~5 down to ~1 after the as-grown sample was ICP-etched, indicating a significant effect of dry etching on defect density (i e., degradation of the PL ratio is correlated with damage to the material).

Example 1

Figure 2B:
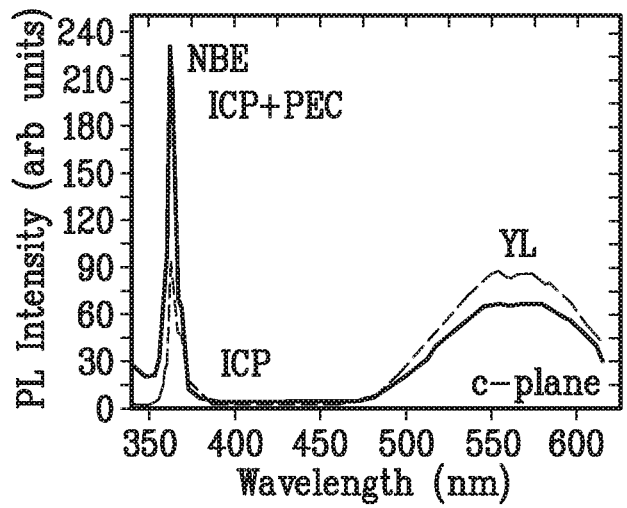
FIG. 2B is a graph of PL of c-plane drift layer before and after ICP PEC etching.
Figure 2C:
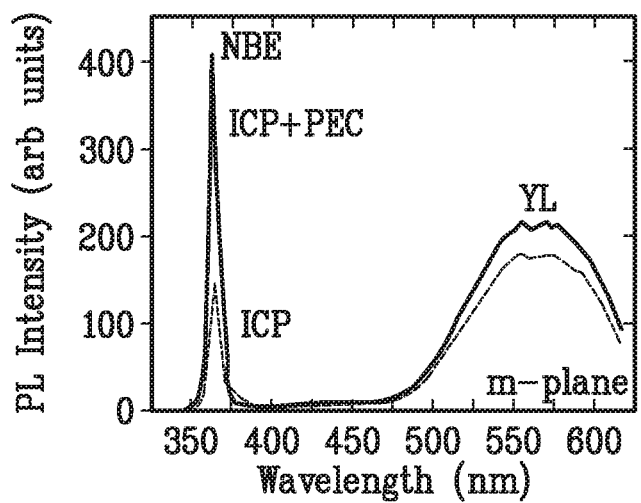
FIG. 2C is a graph of PL of m-plane drift layer before and after ICP PEC etching.

In another experiment, the ICP etched c-plane sample was subjected to PEC-etching in a 0.01 M KOH electrolyte until a depth of ~200 nm was achieved. The 365 nm line of an arc lamp (100 mW/cm$^2$) was used as the excitation source. The PL spectrum is shown in FIG. 2B. The data indicates a strong enhancement of NBE/YL ratio from 1 to 4 which results from etch-induced defect and damage removal using the PEC method. The NBE/YL ratio did not fully recover after the PEC process, which could be due to etch damage being deeper than the targeted PEC etch depth (~200 nm). Therefore, a longer etch may be required.

Example 2

A similar behavior was observed for m-plane samples. The layer stack for an exemplary m-plane diode comprised a 2-µm thick n-GaN template layer ([Si]~7×10$^{17}$ cm$^{-3}$) deposited on an m-plane GaN substrate (Mitsubishi Chemical Corporation). A 250 nm thickness, high-doped n++ GaN layer ([Si]~5×10$^{18}$ cm$^{-3}$) was deposited on the template layer. Finally, a 5-µm thick, low-doped drift layer ($n_0$~6× 10$^{16}$ cm$^{-3}$) was deposited on the thin n$^{++}$ GaN layer. An approximately 400 nm deep trench was ICP etched in the drift layer using BCl$_3$—Cl$_2$ gas mixture. The ICP etch rate was 115 nm/min. Next, the ICP-etched sample was subjected to PEC etching in 0.01 M KOH (150 RPM stirring at 27° C.). Again, the excitation source was a 365 nm arc lamp at 100 mW/cm$^2$.

A slightly lower enhancement of NBE/YL ratio was observed after the PEC process for the m-plane etching of Example 2, than for the c-plane of Example 1. This could be due to the different surface configurations of c- and en-planes and the resulting different nature and concentration of etch-induced defects and damage depths.

The present invention has been described as a method to remove dry-etch damage in Al/In/GaN films by photoelectrochemical etching. It will be understood that the above description is merely illustrative of the applications of the principles of the present invention, the scope of which is to be determined by the claims viewed in light of the specification. Other variants and modifications of the invention will be apparent to those of skill in the art.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein.

While the present teachings have been illustrated with respect to one or more implementations, alterations and/or modifications can be made to the illustrated examples without departing from the spirit and scope of the appended claims. In addition, while a particular feature of the present teachings may have been disclosed with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." Further, in the discussion and claims herein, the term "about" indicates that the value listed may be somewhat altered, as long as the alteration does not result in nonconformance of the process or structure to the illustrated embodiment. Finally, "exemplary" indicates the description is used as an example, rather than implying that it is an ideal.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompasses by the following claims.

What is claimed is:

1. A method comprising:
   providing a substrate comprising an n-type Al/In/GaN semiconductor material;
   dry-etching a surface of the substrate to form a trench therein and causing dry-etch damage to remain on the surface;
   immersing the surface of the substrate in an electrolyte solution; and
   illuminating the surface with above bandgap light having a wavelength that generates electron-hole pairs in the n-type Al/In/GaN semiconductor material, thereby photoelectrochemically etching the surface to remove at least a portion of the dry-etch damage.

2. The method of claim 1, wherein the substrate comprises a freestanding substrate and a layer comprising the n-type Al/In/GaN semiconductor disposed on the freestanding substrate.

3. The method of claim 1, wherein the electrolyte solution comprises KOH.

4. The method of claim 1, wherein the substrate further comprises patterned electrodes disposed on the surface of the substrate.

5. The method of claim 4, wherein the patterned electrodes extract electrons from the substrate and photogenerated holes are pulled to portions of the surface of the substrate, the substrate being etched only at the portions of the substrate having the holes.

6. The method of claim 1, wherein the substrate does not include patterned electrodes disposed on the surface of the substrate.

7. The method of claim 1, wherein the n-type Al/In/GaN semiconductor is chosen from GaN, lnGaN, AlGaN, AlInGaN and combinations thereof.

8. The method of claim 1, wherein the n-type Al/In/GaN semiconductor is chosen from GaN and lnGaN.

9. The method of claim 1, wherein the semiconductor material is an n-type GaN, and the method further comprises regrowing a p-type GaN on the photoelectrochemically etched surface to form a p-n junction.

10. The method of claim 1, wherein the trench comprises both c-plane and m-plane facets.

11. The method of claim 1, wherein the dry etching is an inductively coupled plasma etch process or a reactive-ion etch process.

12. A method for removing dry-etch damage from a substrate surface, the method comprising:
    providing a substrate comprising an n-type Al/In/GaN semiconductor material, a surface of the substrate having dry-etch damage thereon;

immersing the surface of the substrate in an electrolyte solution; and illuminating the surface with above bandgap light having a wavelength that generates electron-hole pairs in the n-type Al/In/GaN semiconductor material, thereby photoelectrochemically etching the surface to remove at least a portion of the dry-etch damage.

13. The method of claim 12, wherein the substrate comprises a freestanding substrate and a layer comprising the n-type Al/In/GaN semiconductor disposed on the freestanding substrate.

14. The method of claim 12, wherein the electrolyte solution comprises KOH.

15. The method of claim 12, wherein the substrate further comprises patterned electrodes disposed on the surface of the substrate, the patterned electrodes extracting electrons from the substrate and photogenerated holes are pulled to portions of the surface of the substrate, the substrate being etched only at the portions of the substrate having the holes.

16. The method of claim 12, wherein the n-type Al/In/GaN semiconductor is chosen from GaN, InGaN, AlGaN, AlInGaN, and combinations thereof.

17. A method for forming a p-n junction, the method comprising:

providing a substrate comprising an n-type GaN semiconductor material;

dry-etching a surface of the substrate to form a trench therein and causing dry-etch damage to remain on the surface;

immersing the surface of the substrate in an electrolyte solution;

illuminating the surface with above bandgap light having a wavelength that generates electron-hole pairs in the n-type GaN semiconductor material, thereby photoelectrochemically etching the surface to remove at least a portion of the dry-etch damage; and regrowing a p-type GaN semiconductor on the photoelectrochemically etched surface to form a p-n junction.

18. The method of claim 17, wherein the substrate comprises a freestanding n-type GaN substrate and an n-type GaN semiconductor layer disposed on the freestanding substrate.

19. The method of claim 17, wherein the electrolyte solution comprises KOH.

20. The method of claim 17, wherein the trench comprises both c-plane and m-plane facets.

\* \* \* \* \*